(12) United States Patent
Ju

(10) Patent No.: US 7,585,174 B2
(45) Date of Patent: Sep. 8, 2009

(54) CONDUCTIVE COMPONENT, ELECTRICAL CONNECTOR, AND CHIP MODULE

(75) Inventor: Ted Ju, Keelung (TW)

(73) Assignee: Lotes Co., Ltd., Keelung (TW)

( * ) Notice: Subject to any disclaimer, the term of this patent is extended or adjusted under 35 U.S.C. 154(b) by 132 days.

(21) Appl. No.: 11/760,020

(22) Filed: Jun. 8, 2007

(65) Prior Publication Data
US 2007/0298629 A1    Dec. 27, 2007

(51) Int. Cl.
*H01R 12/22* (2006.01)
(52) U.S. Cl. ................................................ 439/66
(58) Field of Classification Search ............... 439/66, 439/71, 91, 82, 178, 586
See application file for complete search history.

(56) References Cited

U.S. PATENT DOCUMENTS

| 5,132,058 A * | 7/1992 | Suyama et al. .............. 264/437 |
| 5,431,571 A * | 7/1995 | Hanrahan et al. ............ 439/91 |
| 6,146,152 A | 11/2000 | McHugh et al. |
| 6,854,985 B1 * | 2/2005 | Weiss .......................... 439/91 |
| 7,083,436 B2 * | 8/2006 | Brodsky ....................... 439/91 |

FOREIGN PATENT DOCUMENTS

CN    2442401 Y    8/2001

* cited by examiner

*Primary Examiner*—Alexander Gilman
(74) *Attorney, Agent, or Firm*—Rosenberg, Klein & Lee

(57) ABSTRACT

A conductive component capable of electrically connecting two objects is proposed. The conductive element includes an elastic body that is provided with at least two conductive particles therein. When the conductive component is pressed, a portion of the conductive particles protrudes from the elastic body, thereby forming an electrical connection with external electrical components. In comparison with the prior art, due to the elasticity of the elastic body of the present invention, the conductive component has better elasticity. The conductive particles in the elastic body can protrude from the through holes of the elastic body to connect electrically with the external electrical components. The conductive component of the present invention can assure the efficient electrical connection between the opposing electrical components. The present invention further provides an electrical connector and a chip module that also have the above-mentioned effect.

14 Claims, 5 Drawing Sheets

CONDUCTIVE COMPONENT, ELECTRICAL CONNECTOR, AND CHIP MODULE

BACKGROUND OF THE INVENTION

1. Field of the Invention

The present invention relates to a conductive component, and in particular to a press-contact type electrical connector and a chip module using the conductive component.

2. Description of Prior Art

In the prior art, a press-contact type electrical connector includes an insulating body and conductive terminals accommodated in the insulating body. The insulating body is provided with terminal-accommodating holes in which the conductive terminals are accommodated. The conductive terminal is provided with a fixed portion and contacting portions that are located on both ends thereof. With the two electrical components press and contact each other, an electrical connection is formed between the two electrical components. These conductive terminals are, for example, disclosed in China Patent No. 00217081. However, these types of conductive terminals are generally made of metallic materials and are manufactured by means of a machining process. Therefore, their shapes are complicated. The machining process is also difficult. Further, after being pressed or bent several times, the metallic material generates a plastic deformation and thus the elasticity thereof worsens. As a result, the electrical connector formed by this method cannot contact the electrical components efficiently, thus affecting the performance of the electrical connector.

There are two ways for connecting a CPU to a circuit board of a computer. One is to solder the CPU on the circuit board directly. This method was previously the most commonly adapted method. However, since a CPU connected by this method cannot be replaced, it is difficult to repair and upgrade the computer. Therefore, this solution has been eliminated. The second method is to connect the CPU to the circuit board indirectly by means of an electrical connector. The electrical connector includes an insulating body and conductive terminals accommodated in the insulating body. However, the conductive terminals in this kind of electrical connector are made of metallic materials by means of a press-forming process, and thus the machining process is complicated and expensive. Further, since this kind of electrical connector is not provided with an efficient positioning means, the connection between the CPU and the circuit board is unstable. Therefore, the CPU cannot contact the circuit board efficiently, thus affecting the performance of the CPU.

Thus, according to the above, it is an important issue to provide a conductive component to overcome the above drawbacks.

SUMMARY OF THE INVENTION

The primary object of the present invention is to provide a conductive component that is capable of efficiently forming an electrical connection between the conductive component and a circuit board.

Another object of the present invention is to provide an electrical connector that is capable of efficiently connecting to electrical components.

Another object of the present invention is to provide a chip module that is capable of forming an efficient contact between the chip module and the circuit board, thereby reducing production costs.

In order to achieve the above objects, the present invention provides a conductive component that is capable of electrically connecting two objects. The conductive element includes an elastic body that is provided with at least two conductive particles therein. The conductive particles protrude from the elastic body when pressed, thereby forming an electrical connection between the two electrical components.

The electrical connector of the present invention includes an insulating body having a plurality of terminal-accommodating holes and conductive components provided in the terminal-accommodating holes. The conductive component includes a plurality of conductive particles and elastic bodies provided outside of the conductive particles. The elastic body is provided with at least two through holes. When the conductive component is pressed, a portion of the conductive particles protrudes from the through holes of the elastic body, thereby forming an electrical connection with the external opposing electrical components.

The chip module of the present invention can be electrically connected with the circuit board. The chip module is provided with conductive components for electrically connecting to the circuit board. The conductive component includes elastic bodies that are provided under the chip module. The elastic body is provided therein with at least two conductive particles. The conductive particles protrude from the elastic body when pressed, thereby forming an electrical connection with the circuit board.

In comparison with the prior art, due to the elasticity of the elastic body, the conductive component also has good elasticity. Further, since the conductive particles in the elastic body protrude from the through holes of the elastic bodies to electrically connect with the external electrical components, the electrical connector utilizing the conductive components of the present invention assures an efficient electrical connection between the opposing electrical components. In the chip module of the present invention, the chip module is mounted on the circuit board directly. Therefore, production costs are reduced and the electrical connection between the chip module and the circuit board is formed efficiently.

DETAILED DESCRIPTION OF THE INVENTION

The present invention will be further explained with reference to the accompanying drawings and the embodiments thereof.

Figure 1:
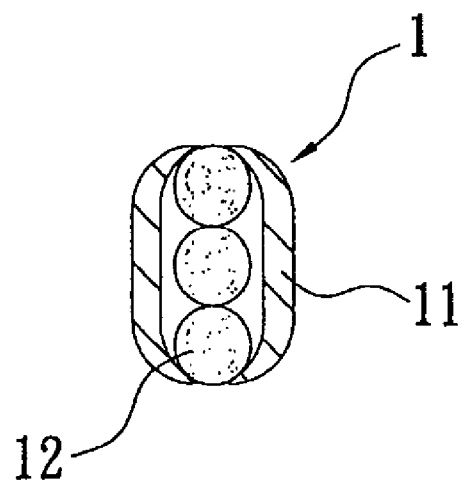
FIG. 1 is a cross-sectional view showing the conductive component of the present invention.

Please refer to FIG. 1. The conductive component 1 of the present invention is capable of electrically connecting two objects, such as a chip module and a circuit board, or two circuit boards (not shown in the figure). The conductive component 1 includes an elastic body 11 that is provided therein with at least two conductive particles 12 (in the present embodiment, the elastic body 11 is provided therein with three conductive particles 12). The conductive particles 12 are arranged in a vertical direction (though the conductive particles 12 can be arranged in a random manner). When pressed, the conductive particles protrude from both ends of the elastic body 11 to contact the two bodies, thereby electrically connecting the two bodies.

Figure 2:
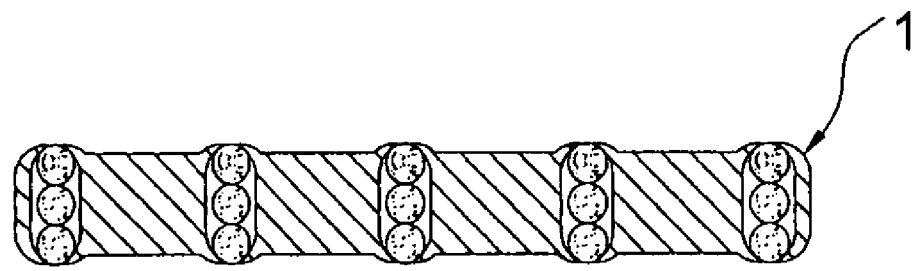
FIG. 2 is a cross-sectional view showing the conductive component of the second embodiment of the present invention.
Figure 3:
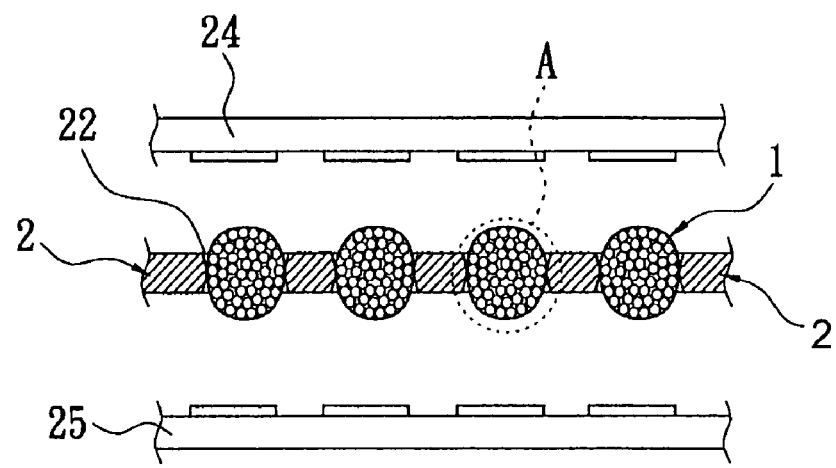
FIG. 3 is an exploded view showing the electrical connector, the chip module and the circuit board of the present invention.
Figure 3A:
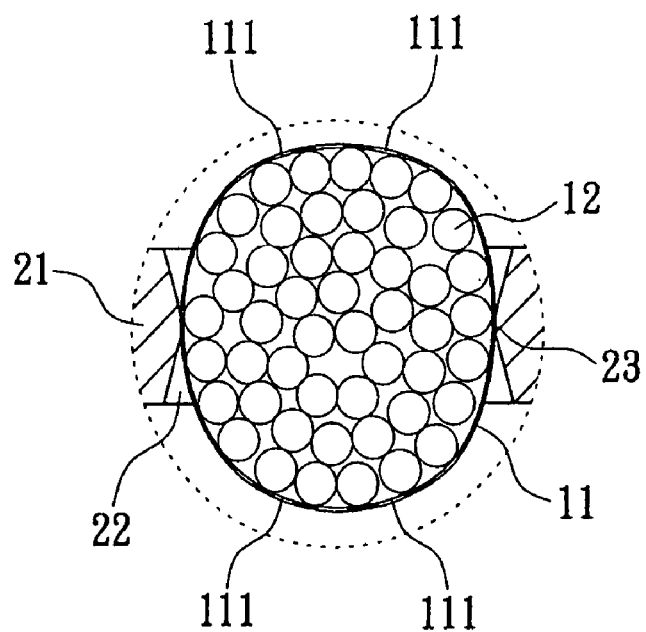
FIG. 3A is a partially enlarged view of the electrical connector shown in FIG. 3.
Figure 4:
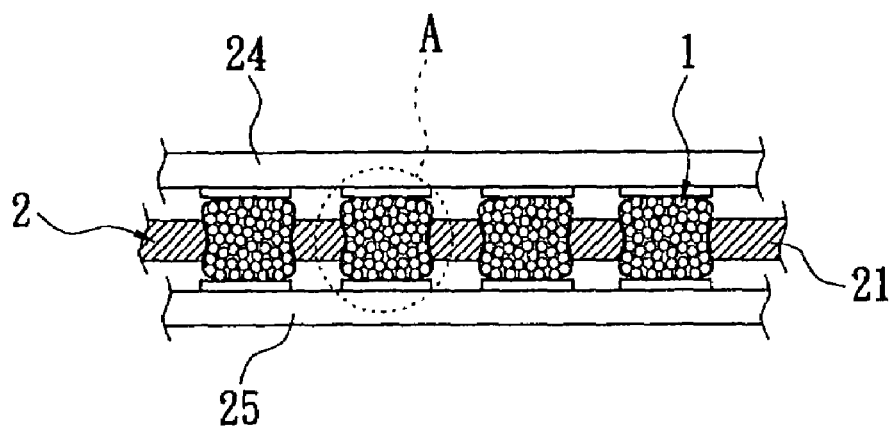
FIG. 4 is an assembled view showing the electrical connector, the chip module and the circuit board of the present invention.
Figure 4A:
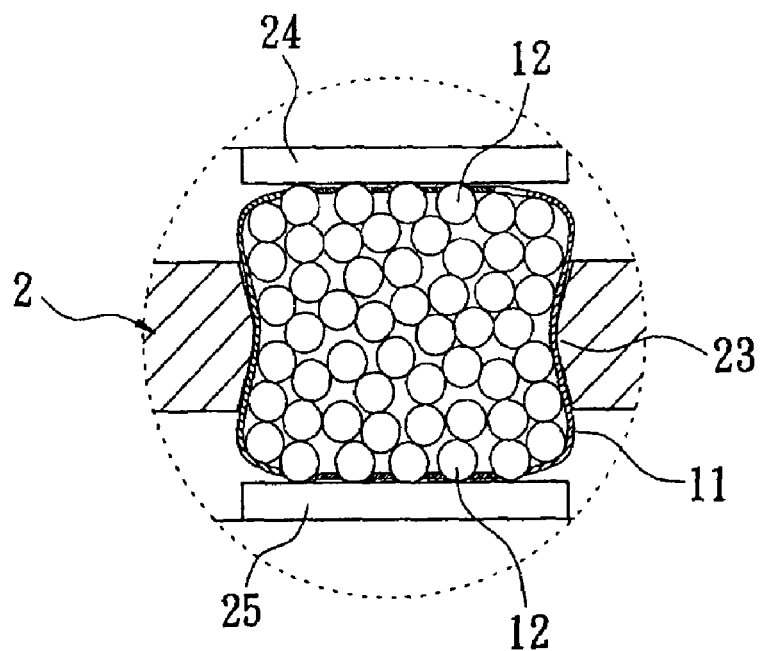
FIG. 4A is a partially enlarged view of FIG. 4.

FIG. 2 shows a second embodiment of the present invention. In this embodiment, a plurality of conductive components 1 constitutes an electrical connector that achieves the same effect as that of the previous embodiment.

Please refer to FIGS. 3, 3A, 4 and 4A. The electrical connector 2 of the present invention is used to connect two opposing electrical components (in the present embodiment being a chip module 24 and a circuit board 25). Other kinds of opposing electrical components can also be connected, such as two opposing circuit boards (not shown). The electrical connector 2 includes an insulating body 21 and a plurality of conductive components 1.

The insulating body 21 is provided thereon with a plurality of terminal-accommodating holes 22 in which the conductive components 1 are accommodated. The terminal-accommodating hole 22 is provided therein with a fixing portion 23 for positioning the conductive component 1. In the present embodiment, the fixing portion 23 is a protrusion that is provided on the wall of the terminal-accommodating hole 22.

In the present embodiment, the conductive component 1 includes a plurality of conductive particles 12 and an elastic body 11 that is provided outside the conductive particle 12 for covering the conductive particles 12. The conductive particles 12 are silver particles (though they can also be other particles having the same properties). The elastic bodies 11 are formed of high-molecular materials. When the conductive components 1 are accommodated in the terminal-accommodating holes 22 of the insulating body 21, both ends thereof protrude from the upper and lower surfaces of the insulating body 21. The elastic bodies 11 also protrude from the upper and lower surfaces of the insulating body 21. Further, the portion of each elastic body 11 that protrudes from the upper and lower surfaces of the insulating body 21 is provided with a plurality of through holes 111 (though the elastic body 11 can only be provided with two through holes 111, and the two through holes 111 are provided on the portion of the elastic body 11 protruding from the upper and lower surfaces of the insulating body 21). Further, the diameter of the conductive particle 12 is larger than that of the through hole 111, thereby ensuring the conductive particles 12 not fall out of the through holes 11 of the elastic body 11.

After the conductive components 1 have been disposed in the insulating body 21, both ends thereof protrude from the upper and lower surfaces of the insulating body 21. When being connected with the chip module 24 and the circuit board 25, the conductive components 1 are pressed so that the conductive particles 12 in the elastic body 11 are also pressed. The pressed portion of the conductive particles 12 (i.e. the conductive particles 12 adjacent to the through holes 111 of the elastic body 11) protrudes from the through holes 111 of the elastic body 11 thereby forming an electrical connection with the chip module 24 and the circuit board 25. In this way, the press-contact between both ends of the electrical connector 2 and the chip module 24 and the circuit board 25 can be achieved.

Figure 5:
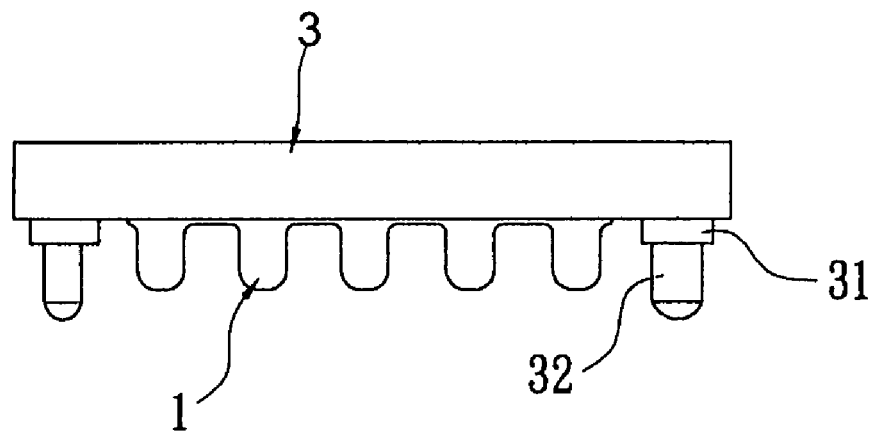
FIG. 5 is a front view showing the chip module of the present invention.
Figure 6:
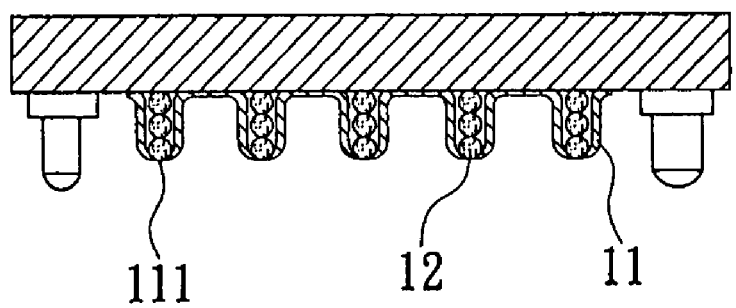
FIG. 6 is a cross-sectional view of the chip module shown in FIG. 5.
Figure 7:
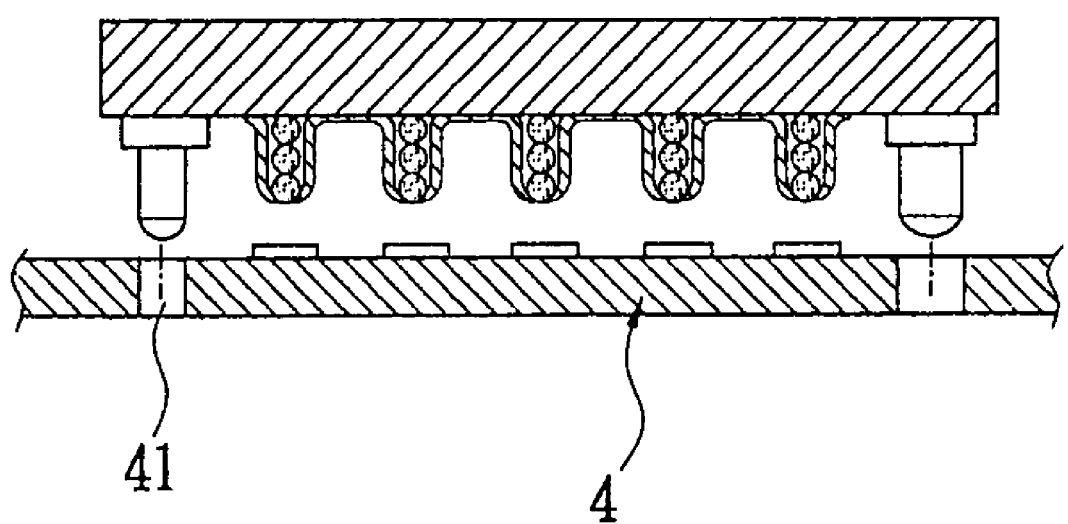
FIG. 7 is a schematic view showing the chip module of the present invention state before it has been fully assembled and a circuit board.

As shown in FIGS. 5 to 7, a chip module 3 utilizes the conductive components 1. The chip module 3 of the present embodiment can be electrically connected with the circuit board 4. The chip module 3 is provided thereon with restricting portions 31 for restricting the press height of the circuit board 31 and positioning portions 32 for cooperating with the circuit board 4. Further, the chip module 3 is provided with conductive components 1 that are electrically connected with the circuit board 4. The conductive components 1 include elastic bodies 11 that are provided under the chip module 3. The elastic body 11 is provided therein with at least two conductive particles 12 (in the present embodiment, the elastic body 11 is provided therein with three conductive particles 12). When pressed, the conductive particles 12 protrude from the elastic body 11, thereby electrically contacting the circuit board 4.

The restricting portions 31 are provided on four corners of the chip module 3. When the restricting portions 31 are connected with the circuit board 4, they can protect the conductive components 1 from being pressed or deformed in any harmful way. Instead, they will be deformed uniformly, thereby facilitating the electrical connection. The positioning portions 32 and the restricting portions are integrally formed (though the positioning portions 32 and the restricting portions 31 can be separated from one another). The positioning portions 32 are formed by means of extending the restricting portions 31. The dimension of each positioning portion 32 is different, thereby having a fool-proof effect. The circuit board 4 is provided thereon with positioning holes 41 for cooperating with the positioning portions 32.

The conductive components 1 extend from the surface of the chip module 3 and include the conductive particles 12 and elastic bodies 11 for positioning the conductive particles 12. The elastic body 11 is an insulating material and is provided with through holes 111 on the underside thereof. The conductive particles 12 do not protrude from the elastic body 11 before they are pressed. After being pressed, a portion of the conductive particles protrudes from the through holes 111 of the elastic body 11 to contact the circuit board 4. The size of the through hole 111 is smaller than the diameter of the conductive particle 12. The conductive particles 12 are arranged in a vertical direction. The conductive particles 12 do not protrude from the elastic body 11 before they are pressed. After being pressed, the conductive particles protrude from the elastic body 11 to contact the circuit board 4 and the chip module 3, thereby forming the electrical connection. The height of the conductive component 1 is larger than the height of the restricting portion 31, but is smaller than the height of the bottom end of the positioning portion 32. In this way, the conductive component can be protected from being pressed in a harmful manner.

In the chip module 3 of the present invention, the restricting portion 31 can prevent the circuit board 4 from being pressed in a harmful manner that causes damage to the chip module 3. The positioning portion 32 has a positioning effect. When being connected with the circuit board 4, the positioning portion 32 can fix to the circuit board 4. When the conductive component 1 is pressed an electrical connection between the chip module 3 and the circuit board 4 can be formed.

The electrical connector 2 of the present invention utilizes conductive components 1 each of which includes conductive particles 12 and the elastic body 11 provided outside of the conductive particles 12 and having at least two through holes 111. When the conductive components 1 are pressed, the conductive particles 12 protrude from the through holes 111 of the elastic body 11 to form an electrical connection with the external opposing electrical components. Due to the elasticity of the elastic body 11, the conductive component 1 also has better elasticity than the prior art. Further, when pressed, the conductive particles 12 of the elastic body 11 protrude from the though holes 111 of the elastic body 11, thereby forming an electrical connection with the external electrical components. In this way, the efficient electrical connection between the opposing electrical components can be assured and the problem that existed in the prior art of forming the conductive components by pressing metals can be prevented.

The chip module 3 of the present invention allows the chip module 3 to be mounted on the circuit board 4 directly, thereby reducing production costs and forming an efficient contact between the chip module 3 and the circuit board 4.

What is claimed is:

1. A conductive component for electrically connecting two objects, comprising:
    an elastic body that is provided with at least two conductive particles therein, the conductive particles protrude from the elastic body when the conductive component is pressed, thereby forming an electrical connection with the two objects;
    wherein the elastic body is provided with through holes, the conductive particles do not protrude from the elastic body before the conductive component is pressed, and a portion of the conductive particles protrudes from the through holes of the elastic body after the conductive component has been pressed; and the size of each through hole is smaller than the diameter of each conductive particle.

2. The conductive component according to claim 1, wherein the elastic body is provided therein with three conductive particles.

3. The conductive component according to claim 1, wherein the conductive component is an electrical connector.

4. An electrical connector, comprising:
    an insulating body having a plurality of terminal-accommodating holes and conductive components provided in the terminal-accommodating holes;
    wherein each of the conductive components comprises an elastic body that is provided with at least two conductive particles therein, the elastic body is provided with at least two through holes, the conductive particles do not protrude from the elastic body before the conductive component is pressed, a portion of the conductive particles protruded from the through holes of the elastic body when the conductive component is pressed, thereby forming an electrical connection with two external electrical components; and the size of each through hole is smaller than the diameter of each conductive particle.

5. The electrical connector according to claim 4, wherein the elastic body protrudes from upper and lower surfaces of the insulating body, the through holes are provided on the portion of the elastic body protruding from the upper and lower surfaces of the insulating body.

6. The electrical connector according to claim 4, wherein the elastic body protrudes from upper and lower surfaces of the insulating body, and each portion protruding from the upper and lower surfaces of the insulating body is provided with a plurality of through holes.

7. The electrical connector according to claim 4, wherein the terminal-accommodating hole is provided with a fixing portion for positioning the conductive components.

8. The electrical connector according to claim 7, wherein the fixing portion is a protrusion provided on the wall of the terminal-accommodating hole.

9. The electrical connector according to claim 4, wherein the conductive components protrude from the upper and lower surfaces of the insulating body to press and contact both ends thereof with two external electrical components.

10. The electrical connector according to claim 4, wherein the conductive particles are silver particles.

11. A chip module electrically connected with a circuit board, comprising conductive components, each of which having an elastic body that is provided under the chip module, the elastic body defining at least two conductive particles therein;
    wherein the conductive particles protrude from the elastic body when the conductive component is pressed, thereby forming an electrical connection with the circuit board; and
    wherein the elastic body is provided with through holes, the conductive particles do not protrude from the elastic body before the conductive components are pressed, and a portion of the conductive particles protrudes from the through holes of the elastic body after the conductive components have been pressed; and the size of each through hole is smaller than the diameter of each conductive particle.

12. The chip module according to claim 11, wherein the elastic body is an insulating material.

13. The chip module according to claim 11, further comprising restricting portions for restricting the press height of the circuit board and positioning portions for cooperating with the circuit board.

14. The chip module according to claim 13, wherein the height of the conductive component is larger than the height of the restricting portion, but is smaller than the height of the bottom end of the positioning portion.

* * * * *